United States Patent
Jeong et al.

(10) Patent No.: US 6,461,975 B1
(45) Date of Patent: Oct. 8, 2002

(54) METHOD OF ETCHING INSULATING LAYER IN SEMICONDUCTOR DEVICE

(75) Inventors: Sang-sup Jeong, Suwon; Tae-hyuk Ahn, Yongin, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 28 days.

(21) Appl. No.: 09/685,097

(22) Filed: Oct. 11, 2000

(30) Foreign Application Priority Data

Oct. 26, 1999 (KR) .............................................. 99-46631

(51) Int. Cl.$^7$ ............................................. H01L 21/302
(52) U.S. Cl. ....................................... 438/714; 438/723
(58) Field of Search .................................. 438/706, 710, 438/712, 714, 723, 724

(56) References Cited

U.S. PATENT DOCUMENTS

| | | | |
|---|---|---|---|
| 4,581,101 | * 4/1986 | Senoue et al. | 134/1 |
| 4,711,698 | * 12/1987 | Douglas | 204/192.32 |
| 5,635,022 | * 6/1997 | Vaartstra | 216/79 |
| 6,322,715 | * 11/2001 | Sekiya et al. | 216/67 |

* cited by examiner

*Primary Examiner*—Benjamin L. Utech
*Assistant Examiner*—Kin-Chan Chen
(74) *Attorney, Agent, or Firm*—Volentine Francos, PLLC

(57) ABSTRACT

A method for etching an insulating layer in a semiconductor device includes forming an insulating layer, such as silicon oxide or silicon nitride layer, on a semiconductor substrate and dry etching the insulating layer using a reactive gas including Ar, and $C_4H_xF_{8-x}O$, wherein x is an integer from 0 to 4. The reactive gas may further include oxygen gas.

14 Claims, 4 Drawing Sheets

METHOD OF ETCHING INSULATING LAYER IN SEMICONDUCTOR DEVICE

BACKGROUND OF THE INVENTION

1. Field of the Invention

The present invention relates to a method for manufacturing a semiconductor device and more particularly, to a method for dry etching an insulating layer using a novel plasma.

2. Description of the Related Art

Highly integrated semiconductor devices with a capacity of 256 M or higher require intricate process steps to achieve the desired performance threshold. One such process involves etching a silicon oxide layer in order to form a small and deep contact having a high aspect ratio. Furthermore, to increase the integration density, a self aligned contact (SAC) process is implemented as well. For each of these processes, a high selectivity ratio is an important requirement.

A gas from the fluorocarbon ($C_xF_y$)-series is generally used in etching silicon oxide. For example, a gas having a high ratio of carbon to fluorine, such as $C_3F_8$ or $C_4F_8$, is used in the etching process. Moreover, to increase the selectivity ratio, a gas from the hydroflurocarbon ($C_xH_yF_z$)-series is added to the fluorocarbon gases. Furthermore, when dry etching a silicon oxide at a high selectivity ratio, oxygen and oxygen-containing gases such as carbon monoxide (CO) must be added to $C_4F_8$ gas. The oxygen or carbon monoxide is added for preventing etch stopping or for controlling the profile of a contact hole to be formed.

Of course, in order to add oxygen gas, a process of controlling the supply of oxygen gas must be employed. Thus, it becomes more complicated to control the overall process of dry etching. Likewise, it is necessary to separately install a gas supply system in the etching equipment to deliver the oxygen gas, which makes the structure of the etching equipment more intricate.

SUMMARY OF THE INVENTION

To solve the above problems, it is a feature of the present invention to provide a method for etching an insulating layer in a semiconductor device with a novel etching reactive gas, which novel etching reaction gas replaces the fluorocarbon ($C_xF_y$)-series gas.

Accordingly, to achieve the above feature, the present invention provides a method of etching an insulating layer, such as a silicon oxide layer or silicon nitride layer, on a semiconductor substrate by dry etching the insulating layer with a reactive gas containing Ar and $C_4H_xF_{8-x}O$, wherein x is an integer from 0 to 4.

Preferably, the $C_4H_xF_{8-x}O$ gas is $C_4F_8O$, wherein x is 0. In this case, the reactive gas can be a mixed gas of $C_4F_8O$ gas and $C_4H_xF_{8-x}O$, wherein x is an integer from 1 to 4. The oxygen component of the reactive gas may be oxygen gas, or an oxygen-containing gas such as carbon monoxide or carbon dioxide. The reactive gas may further include $C_xF_y$ gas, wherein x is an integer from 1 to 6, and y is an integer from 2 to 12. Furthermore, the reactive gas may include $C_xH_yF_z$ gas wherein x is an integer from 1 to 6, y is an integer from 1 to 4, and z is an integer from 2 to 10.

BRIEF DESCRIPTION OF THE DRAWINGS

The above feature and other advantages of the present invention will become more apparent by describing in detail a preferred embodiment thereof with reference to the attached drawings in which.

DETAILED DESCRIPTION OF THE INVENTION

Figure 1:
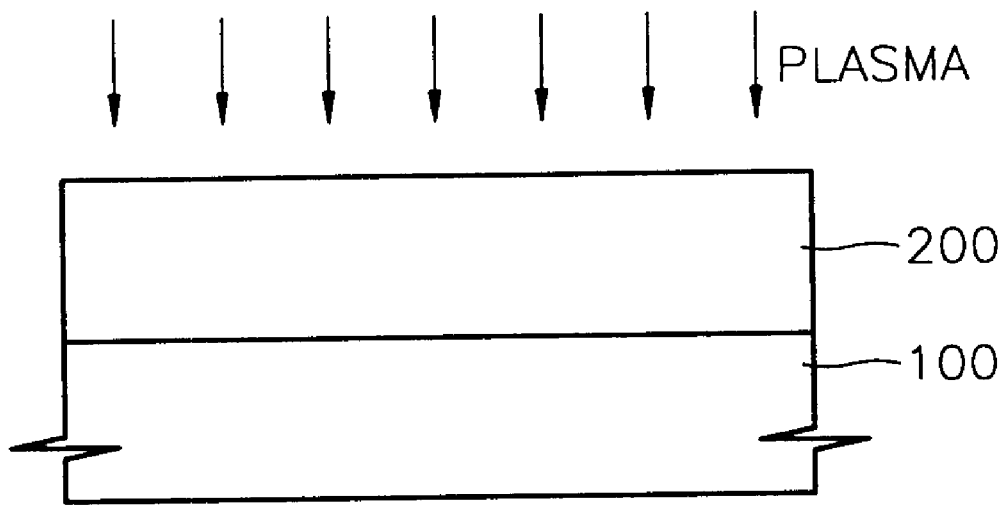
FIG. 1 is a side view showing a method of etching an insulating layer in a semiconductor device according to an embodiment of the present invention.

The present invention will now be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the size of elements is exaggerated for clarity, and the same reference numerals in different drawings represent the same element. Further, it will be understood that when a layer is referred to as being "on" another layer or substrate, it can be directly on the other layer or substrate, or intervening layers may also be present.

FIG. 1 is a side view showing a method of etching an insulating layer in a semiconductor device according to an embodiment of the present invention. Specifically, an embodiment of the present invention presents a method of using plasma excited from an etching reactive gas containing $C_4H_xF_{8-x}O$ gas in dry etching an insulating layer 200 provided over a semiconductor substrate 100. The insulating layer 200 may be formed of either silicon nitride ($Si_3N_4$) or silicon oxide ($SiO_2$), but the latter is more commonly used.

The $C_4H_xF_{8-x}O$ gas is an oxygen-containing fluorocarbon-series gas, which inherently contains oxygen that is required for preventing etch stopping or for controlling a profile during the process of etching a silicon oxide layer.

As described in Y. Chinzei et al., "*High aspect ratio SiO$_2$ etching with high resist selectivity improved by addition of organicsilane to Tetrafluoroethyl Trifluoromethyl Ether*", Proceeding of Symposium on Dry Process, p267, 1997, an oxygen-containing HydroFluorocarbonEther (HFE) series gas can be substituted for a PerFluoroCarbon (PFC) gas such as $C_4F_8$ in an etching process. Although the HFE gas is advantageous in that it has a lesser effect on global warming, it is known that the HFE gas does not perform as well as the PFC gas in the etching process.

Figure 2:
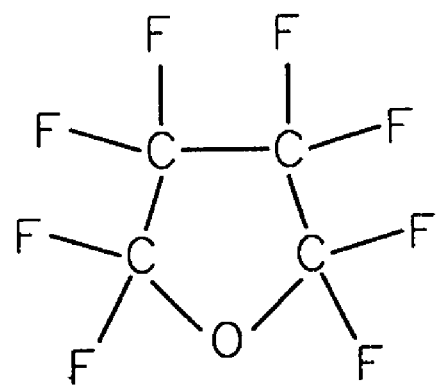
FIG. 2 is a chemical structural diagram showing the basic structure of $C_4F_8O$ used in the method of etching an insulating layer in a semiconductor device shown in FIG. 1.

In the present invention, however, the $C_4H_xF_{8-x}O$ gas used as a reactive gas, which replaces the fluorocarbon ($C_xF_y$)-series gas, achieves an etching process capability at least comparable to an etching process using the conventional PFC gas. In the dry etching method of the present invention using $C_4H_xF_{8-x}O$, the integer x is the range of 0–4. The embodiment is exemplified by a dry etching method using perfluorotetrahydrofuran ($C_4F_8O$) gas. $C_4F_8O$ has the basic structure shown in FIG. 2. Specifically, $C_4F_8O$ gas is a cyclic compound in which oxygen is included in a fluorocarbon chain. In other words, the basic back-bone forms a pentagon ring by linking four carbon atoms and one oxygen atom. Two fluorine atoms are bonded to each carbon atom. Thus, the $C_4F_8O$ gas and the conventional $C_4F_8$ gas have the same ratio of carbon to fluorine, yet the $C_4F_8$ gas contains oxygen in a carbon chain. As a result, the $C_4F_8O$ gas has a more than sufficient etching selectivity ratio and etching capability compared with $C_4F_8$.

The structure of $C_4F_8O$ gas involves a C—O—C linkage in the basic back-bone. Such a C—O—C linkage is known to have a higher reactivity compared with a C—C linkage because of the existence of oxygen. Thus, $C_4F_8O$ gas should have a higher reactivity compared to $C_4F_8$ gas whose basic structure is a C—C linkage. This means that the $C_4F_8O$ gas can be dissociated at a lower energy, representing a higher plasma dissociation degree, as compared with $C_4F_8$ gas.

Furthermore, due to the relatively high reactivity, $C_4F_8O$ gas has a shorter atmospheric lifetime compared with a PFC gas such as $C_4F_8O$, resulting in a lower global warming potential (GWP). Indeed, $C_4F_8O$ has a GWP value that is 20% lower than that of $C_4F_8$.

In a dry etching process using $C_4F_8$, for example, the quantity of the remaining $C_4F_8$ exhausted after a dry etching process without dissociation is about 10–15% of the supplied source gas. By contrast, the same dry etching process performed using the $C_4F_8O$ gas results in a remaining quantity of exhausted $C_4F_8O$ gas of about 5%. This shows that the dissociation degree of $C_4F_8O$ is relatively high. Further, when $C_4F_8O$ is used according to an embodiment of the present invention, PFC emissions are mitigated.

The $C_4H_xF_{8-x}O$ gas, wherein x is an integer in the range of 1–4, has a similar structure to that of $C_4F_8O$. The only difference is that hydrogen substitutes for fluorine in the structure of $C_4F_8O$ gas shown in FIG. 2. Thus, they have basically the same structure as $C_4F_8O$; a ring structure of four carbon atoms and one oxygen linkage. This means that the $C_4H_xF_{8-x}O$ gases have the same effect and advantages as previously described with respect to the $C_4F_8O$ gas.

Figure 3:
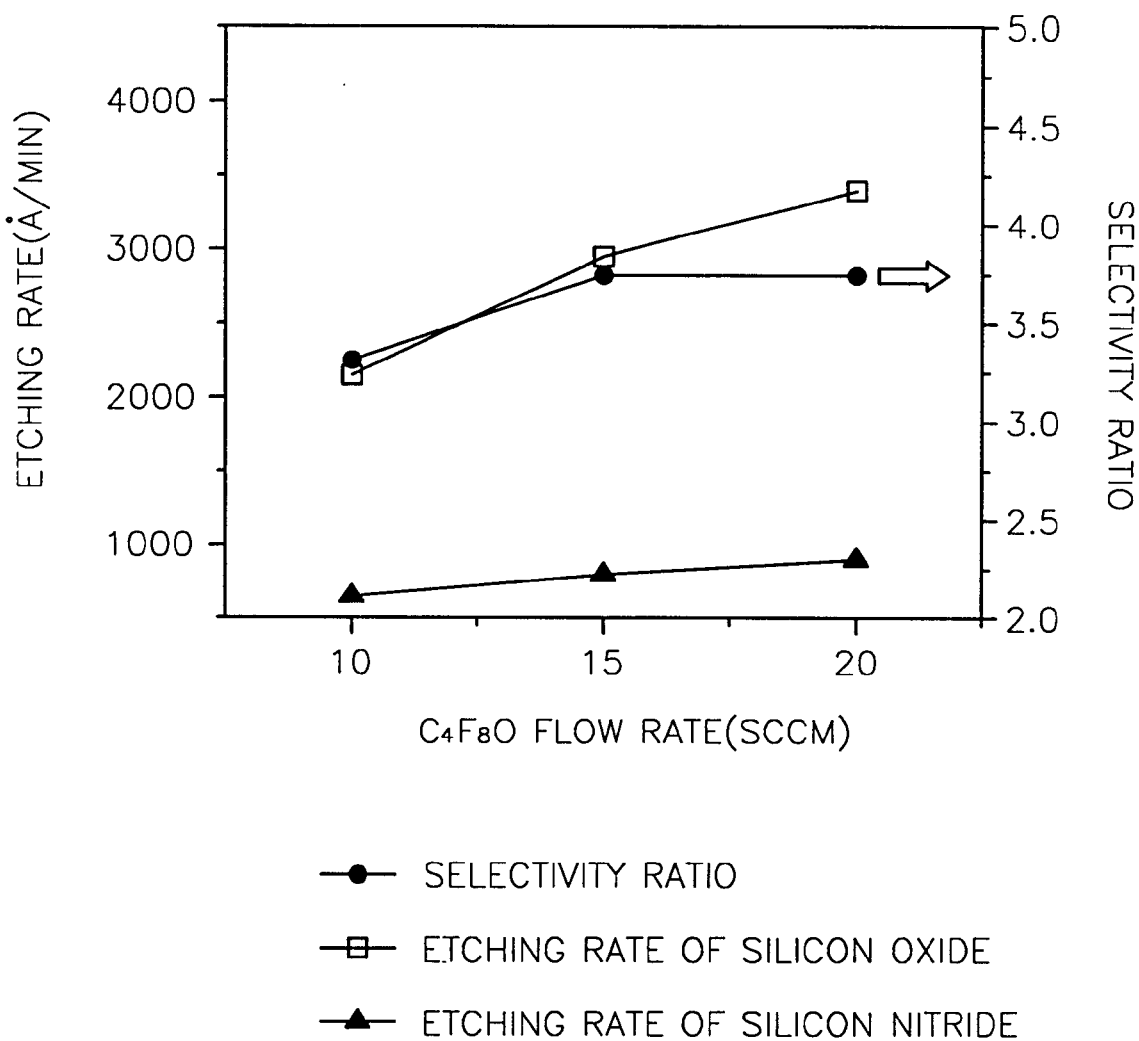
FIG. 3 is a graph showing the change in etching rate, which is measured based on an etching method using $C_4F_8O$ gas according to an embodiment of the present invention, with respect to the supply quantity of $C_4F_8O$ gas.
Figure 4:
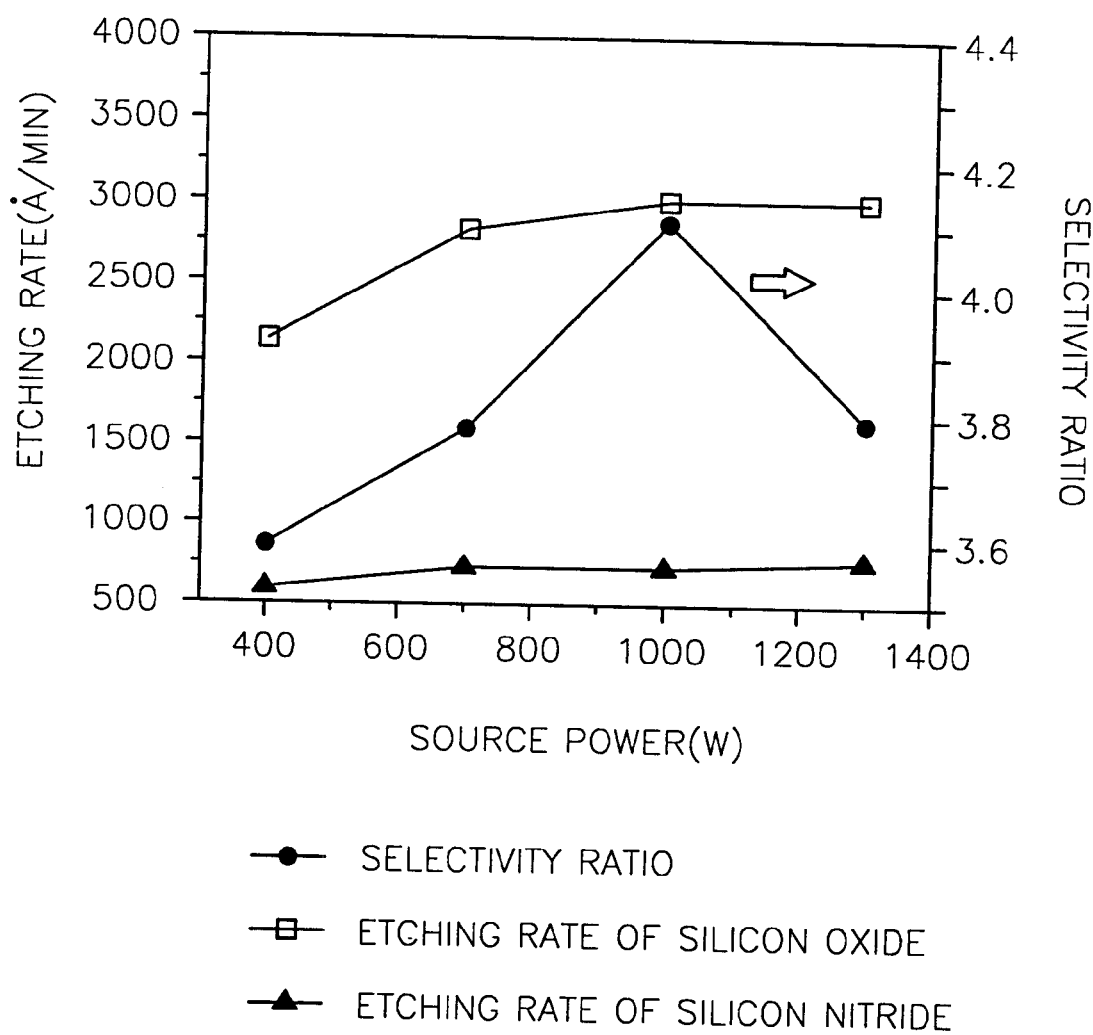
FIG. 4 is a graph showing the change in etching rate, which is measured based on an etching method using $C_4F_8O$ gas according to an embodiment of the present invention, with respect to an applied source power.

FIGS. 3 and 4 are graphs schematically showing the etching rates of insulating layers like silicon oxide and silicon nitride, which are measured based on the dry etching method using $C_4F_8O$ according to an embodiment of the present invention, with respect to the supplied quantity of $C_4F_8O$ gas and the applied source power, respectively. Specifically, in order to assure the etching capability of $C_4F_8O$ according to an embodiment of the present invention, an etching experiment was conducted using test samples in which only a blanket silicon oxide layer and a blanket silicon nitride layer were formed over a semiconductor substrate. In this case, a surface wave plasma (SWP) etcher available from Sumitomo Co. (Japan), was used as the etching equipment.

Referring to FIG. 3, a source power of about 1,300 W and a bias power of about 1,400 W were applied, and as the flow rate of $C_4F_8O$ gas was varied, the etching rates of layers in the test samples were measured. A selectivity ratio was calculated as the etching rate ratio of the silicon oxide layer to the silicon nitride layer. $C_4F_8O$ gas was diluted with Ar, which was supplied therewith at a flow rate of 450 standard cubic centimeters per minute (sccm), and provided to the etching equipment. A chamber, in which the test samples were loaded, was maintained at a pressure of about 25 mTorr. FIG. 3 shows that the etching process of the present invention has a better etching rate and selectivity ratio compared with a conventional etching process. Further, since the etching rate changes depending on the flow rate of $C_4F_8O$ gas, the etching rate or selectivity ratio of silicon oxide or silicon nitride can be adjusted by controlling the flow rate of $C_4F_8O$ gas.

Referring to FIG. 4, dry etching was conducted in a chamber maintained at a pressure of about 25 mTorr and $C_4F_8O$ gas was supplied at a flow rate of about 15 sccm. Like FIG. 3, a bias power of 1,400 W was applied and Ar was supplied as a dilution gas at 450 sccm. Then the changes in etching rate with respect to an applied source power were measured.

As shown in FIG. 4, changes in the etching rate occurred based on each layer by a change in source power applied for generating plasma, i.e., a microwave power applied to the etching equipment. As with a typical etching process, as source power increases, the etching rate of a silicon oxide layer increases. However, the etching rate in a low source power region is reduced by a relatively small amount compared with a conventional etching method using $C_4F_8$. This means that the supply of an etchant is not reduced significantly despite a reduction in source power since the dissociation of $C_4F_8O$ into plasma can easily occur in a low source power region.

It should be noted that the etching conditions for such results are presented only as an exemplary embodiment of the present invention, and should not be construed as limiting the present invention.

Figure 5:
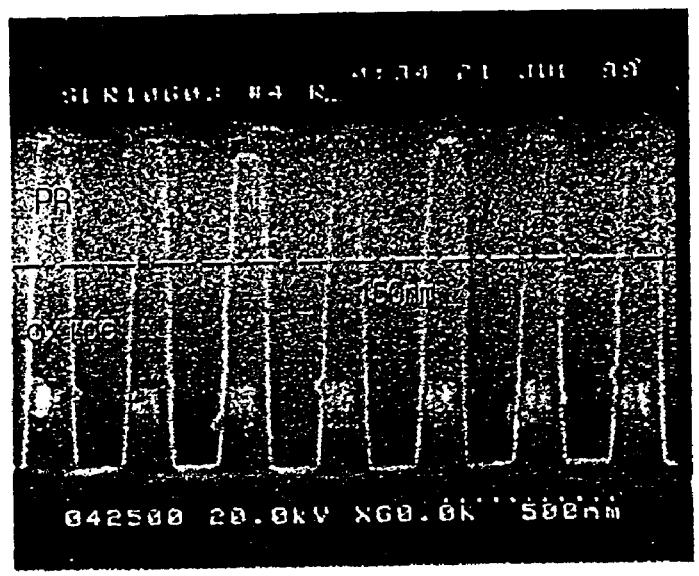
FIGS. 5 and 6 are electronic scanning microscope photographs illustrating the results of forming a contact hole by a method of etching an insulating layer according to an embodiment of the present invention.
Figure 6:
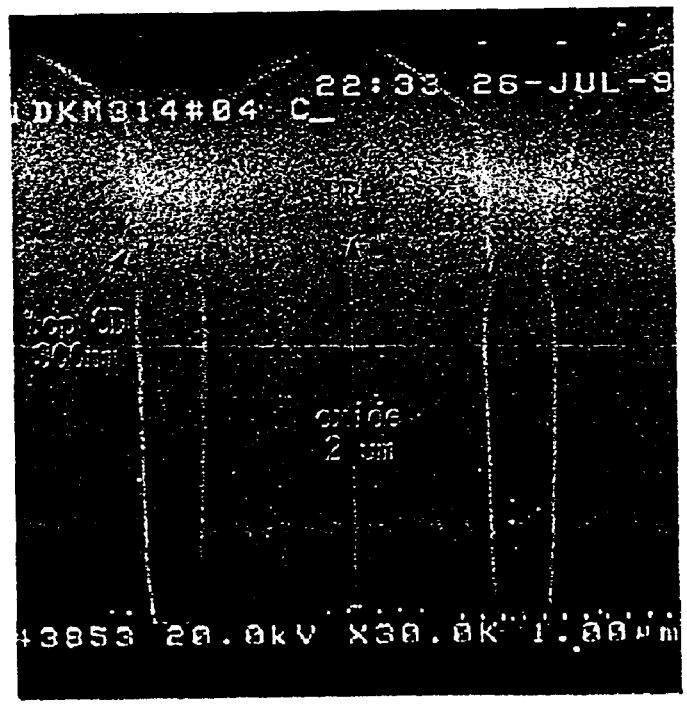

FIGS. 5 and 6 depict the result of forming a contact hole by applying a method of etching an insulating layer according to an embodiment of the present invention. FIG. 5 shows the result of etching a minute contact hole having a diameter of about 150 nm by the use of a mixed gas in which $C_4F_8O$ is diluted by Ar gas. In this case, $C_4F_8O$ gas was supplied at a flow rate of about 15 sccm and diluted by Ar gas supplied at a flow rate of 450 sccm. As described in FIGS. 3 and 4, the SWP etcher available from Sumitomo Co., was used as the etching equipment.

As shown in FIG. 5, when a dry etching method according to an embodiment of the present invention is employed for forming a minute contact hole, selectivity to photoresist is high, and the contact hole has a well-formed vertical profile. Thus, the result shown in FIG. 5 proves that an etching method using $C_4F_8O$ according to the embodiment of the present invention can obtain a more than equal process capability compared with an etching method using a conventional mixed gas of $C_4F_8/O_2/Ar$.

FIG. 6 shows the result of etching a contact hole having an aspect ratio of about 7 by the use of a mixed gas in which $C_4F_8O$ is diluted by Ar. In this case, a contact hole has a top critical dimension of 300 nm and a depth of about 2 $\mu$m. As shown in FIG. 6, an etching method with the use of $C_4F_8O$ according to an embodiment of the present invention can suppress a profile default such as bowing to form a contact hole having a well-formed vertical profile. Further, in terms of selectivity to photoresist, an improved selectivity to photoresist of about 3.3 can be obtained on the basis of the etching rate of a facet on the edge of the photoresist.

It can be seen from these results that a dry etching method that uses $C_4F_8O$ gas according to an embodiment of the present invention can achieve a more than equal process capability in forming a contact hole compared with the conventional process. This can be specifically corroborated by the data in Table 1.

TABLE 1

Comparison of Process Characteristics of a Silicon Oxicide Layer

| | Reactive gas | |
|---|---|---|
| Process characteristics | $C_4F_8/O_2/CO/Ar$ | $C_4F_8O/Ar$ |
| Etching rate | 6000 Å/min | 6000 Å/min |
| Profile angle | 87–89° | 89° |
| Selectivity to photoresist | 3–5 | 3–7 |
| Selectivity to Si | 15 | 15 |
| Selectivity to $Si_3N_4$ | 10 | 10 |

The results shown in Table 1 were derived from cases in which a contact hole was formed by a dry etching method using a mixed gas of $C_4F_8/O_2/Ar$, which is a conventional etching reactive gas, and a mixed gas of $C_4F_8O/Ar$ according to an embodiment of the present invention. In the former case, the result was obtained under the conditions that $C_4F_8$, $O_2$, CO, and Ar were supplied at flow rates of about 10, 5, 30, and 400 sccm, respectively. In addition, the SWP etcher available from Sumitomo Co. was used as the etching equipment, the etching chamber was maintained at a pressure of 20 mTorr, and a source power of 1,600 W and a bias power of 1,400 W were applied. In the latter case, $C_4F_8O$ and Ar were supplied at flow rates of 15 and 45 sccm, respectively. Further, a source power of 1,600 W, a bias power of 1,400 W, and a chamber pressure condition of 24 mTorr were applied thereto. Selectivity to photoresist in Table 1 was measured on the basis of the etching rate of a facet on the edge of photoresist.

As indicated in Table 1, a dry etching method that uses $C_4F_8O$ gas according to an embodiment of the present invention achieves a more than equal process capability compared with the conventional dry etching process which uses $C_4F_8$.

As described in the foregoing, an embodiment of the present invention is described with reference to a dry etching method that uses $C_4F_8O$. However, $C_4F_8O$ can be replaced with $C_4H_xF_{8-x}O$ wherein x is an integer from 1 to 4, such as $C_4H_1F_7O$ or $C_4H_2F_6O$. $C_4H_xF_{8-x}O$ gas can obtain the same effect as $C_4F_8O$ described above since the former has a structure in which hydrogen merely substitutes for fluorine in the structure of the latter shown in FIG. 2. This is mainly because $C_4H_xF_{8-x}O$ gas has a high degree of dissociation compared to $C_4F_8$ since the former has a C—O—C linkage like the $C_4F_8O$ gas. Further, a $C_4H_xF_{8-x}O$ gas can be used by itself, or it may added to the $C_4F_8O$ gas in the dry etching process.

$C_4H_xF_{8-x}O$ and $C_4F_8O$ already contain oxygen, therefore they need not any extra oxygen as in the conventional $C_4F_8$ process, and thus do not need an additional supply of oxygen gas or oxygen-containing gas such as CO. Thus, as described above, in using $C_4H_xF_{8-x}O$ or $C_4F_8O$ gas, the process controls and the structure of the etching equipment can be simplified.

Further, when oxygen gas is additionally provided as in a conventional dry etching method, a process characteristic can be varied depending on a change in the flow rate of oxygen gas provided. This can present a challenge in process stability. However, since the present invention can avoid providing the oxygen separately, the process stability and process repeatability can be enhanced. Additionally, PFC emissions can be reduced due to the relatively high dissociation degree and low GWP of $C_4F_8O$ or the like.

Although $C_4H_xF_{8-x}O$ or $C_4F_8O$ gas does not require the supply of extra oxygen as described above, oxygen gas or oxygen-containing gas can be additionally supplied when necessary if desired. In this case, oxygen, carbon monoxide, or carbon dioxide can be mixed with $C_4F_8O$ at about 5–60%. Further, when using $C_4F_8O$, fluorocarbon-series or hydrofluorocarbon-series gases can be added thereto when necessary. For example, $C_xF_y$, wherein x is an integer from 1 to 6, and y is an integer from 2 to 12, can be additionally used. Alternatively, $C_xH_yF_z$, wherein x is an integer from 1 to 6, y is an integer from 1 to 4, and z is an integer from 2 to 10, can be added.

When $C_4F_8O$ is used, Ar can be used as a dilution gas as described above. Further, an inert gas equivalent to Ar, for example, He, Kr or Xe can be used as a dilution gas.

Although the invention has been described with reference to a particular embodiment, it will be apparent to one of ordinary skill in the art that modifications of the described embodiment may be made without departing from the spirit and scope of the invention.

What is claimed is:

1. A method for etching an insulating layer in a semiconductor device comprising:

forming an insulating layer on a semiconductor substrate; and dry etching the insulating layer by subjecting the insulating layer to a reactive gas comprising a dilution gas and cyclic $C_4H_xF_{8-x}O$ gas, wherein x is an integer from 1 to 4.

2. The method of claim 1, wherein during the dry etching, the reactive gas comprises a mixture of cyclic $C_4F_8O$ gas and the cyclic $C_4H_xF_{8-x}O$ gas, wherein x is an integer from 1 to 4.

3. The method of claim 1, wherein during the dry etching, the reactive gas further comprises oxygen gas.

4. The method of claim 1, wherein during the dry etching, the reactive gas further comprises an oxygen-containing gas.

5. The method of claim 4, wherein during the dry etching, the oxygen-containing gas is one of carbon monoxide gas and carbon dioxide gas.

6. The method of claim 1, wherein during the dry etching, the reactive gas further comprises one of $C_xF_y$, wherein x is an integer from 1 to 6 and y is an integer from 2 to 12, and $C_xH_yF_z$, wherein x is an integer from 1 to 6, y is an integer from 1 to 4, and z is an integer from 2 to 10.

7. The method of claim 1, wherein the insulating layer is formed as one of a silicon oxide layer and a silicon nitride layer.

8. The method of claim 1, wherein x is 1.

9. The method of claim 1, wherein the dilution gas is at least one selected from the group consisting of Ar, He, Kr and Xe.

10. The method of claim 1, wherein the dilution gas is Ar.

11. The method of claim 10, wherein x is 1.

12. The method of claim 1, wherein x is 2.

13. The method of claim 1, wherein x is 3.

14. The method of claim 1, wherein x is 4.

* * * * *